United States Patent
Endo et al.

(10) Patent No.: US 6,392,940 B2
(45) Date of Patent: May 21, 2002

(54) SEMICONDUCTOR MEMORY CIRCUIT (75) Inventors: Nobuyuki Endo; Yoshimasa Sekino; Hitoshi Yamada, all of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/741,888

(22) Filed: Dec. 22, 2000

(30) Foreign Application Priority Data

Dec. 27, 1999 (JP) .............................................. 11-370431

(51) Int. Cl.[7] ................................................. G11C 7/00
(52) U.S. Cl. .................................... 365/201; 365/230.06
(58) Field of Search ............................. 365/201, 230.06

(56) References Cited

U.S. PATENT DOCUMENTS 6,266,286 B1 * 7/2001 Cho et al. .................... 365/201

* cited by examiner

Primary Examiner—M. Tran
(74) Attorney, Agent, or Firm—Volentine Francos, PLLC (57) ABSTRACT A memory circuit includes a plurality of word lines connected to a plurality of memory cells, a plurality of row address decode circuits having address input terminals, a first wafer burn-in signal terminal, and a second wafer burn-in signal terminal. The row address decode circuits activate all of the word lines when the first wafer burn-in signal and the second wafer burn-in signal are in an enable state. On the other hand, the row address decode circuits activate a subset of the word lines when the second wafer burn-in signal is in the enable state.

6 Claims, 11 Drawing Sheets

SEMICONDUCTOR MEMORY CIRCUIT

BACKGROUND OF THE INVENTION

1. Field of the Invention

The present invention relates to a semiconductor memory circuit, and particularly to a row address decode circuit for a semiconductor memory circuit.

2. Description of the Related Art

Figure 9:
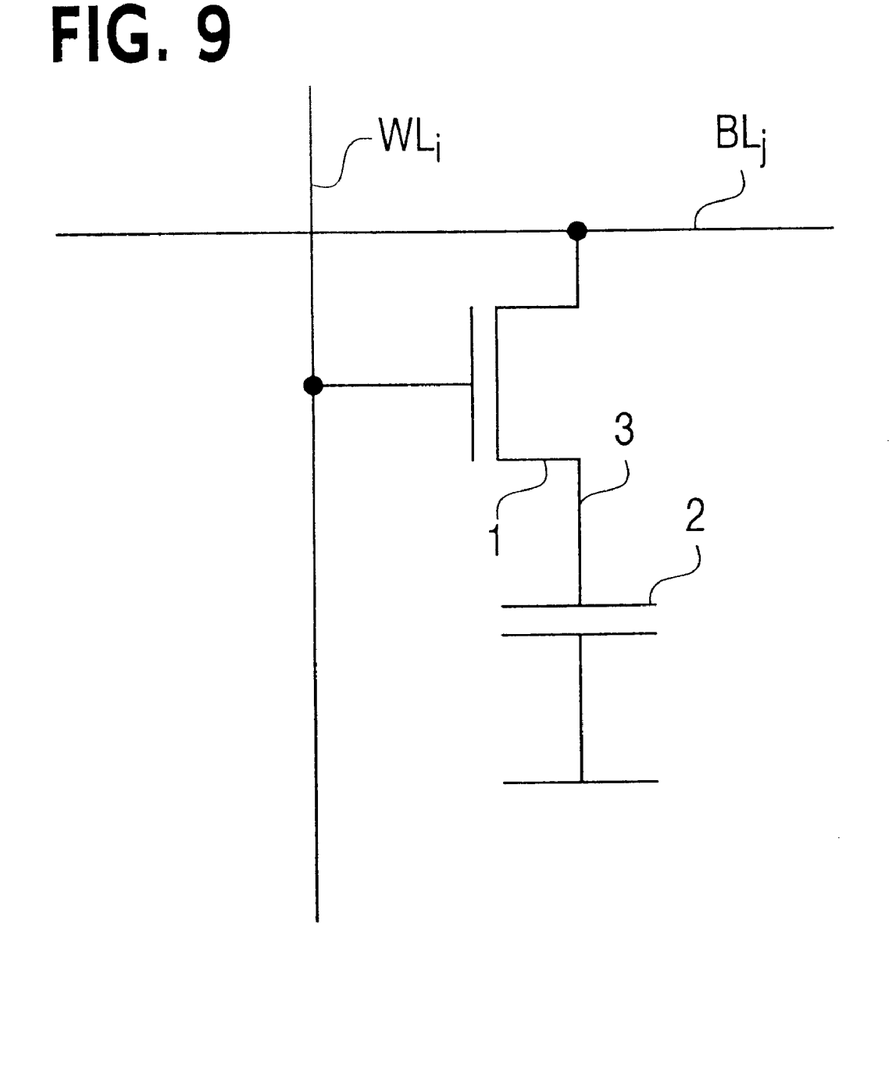
FIG. 9 is a circuit diagram of a memory cell.

FIG. 9 is a circuit diagram of a memory cell. The memory cell has an NMOS transistor 1, a capacitor 2, a word line WLi, and a bit line BLj. As the semiconductor memory circuit has many memory cells, a plurality of word lines WLi(i=1,2,3 . . .) and bit lines BLj are disposed in a matrix pattern. One of the word lines is selected and raised to a predetermined potential during each "data read" or "data write" operation.

To check the reliability of the semiconductor memory circuit, a wafer burn-in test is performed. During the wafer burn-in test, all of the word lines are raised to the predetermined potential at the same time to shorten the time needed to carry out the test.

Figure 10:
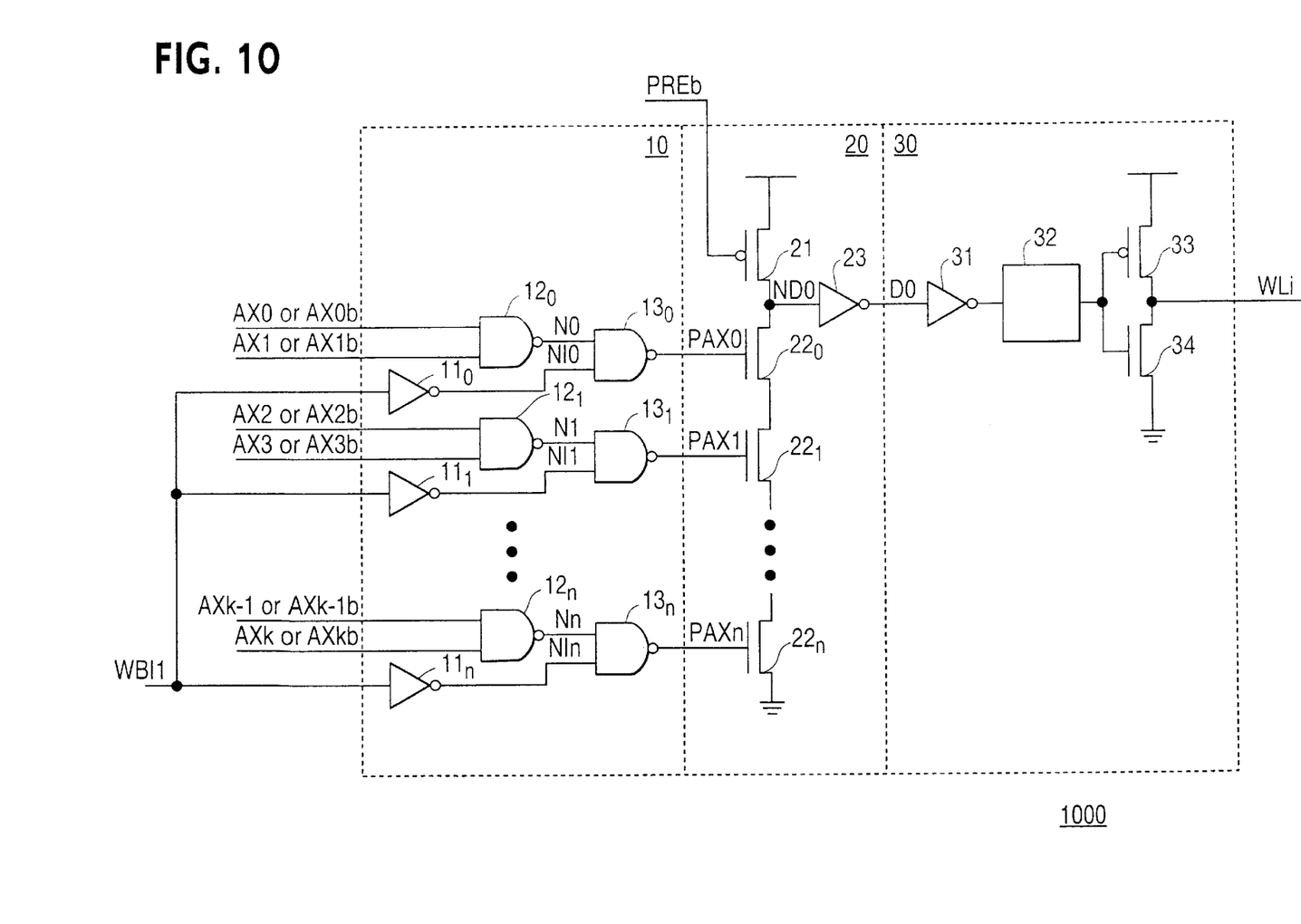
FIG. 10 is a circuit diagram of a row address decode circuit.
Figure 11:
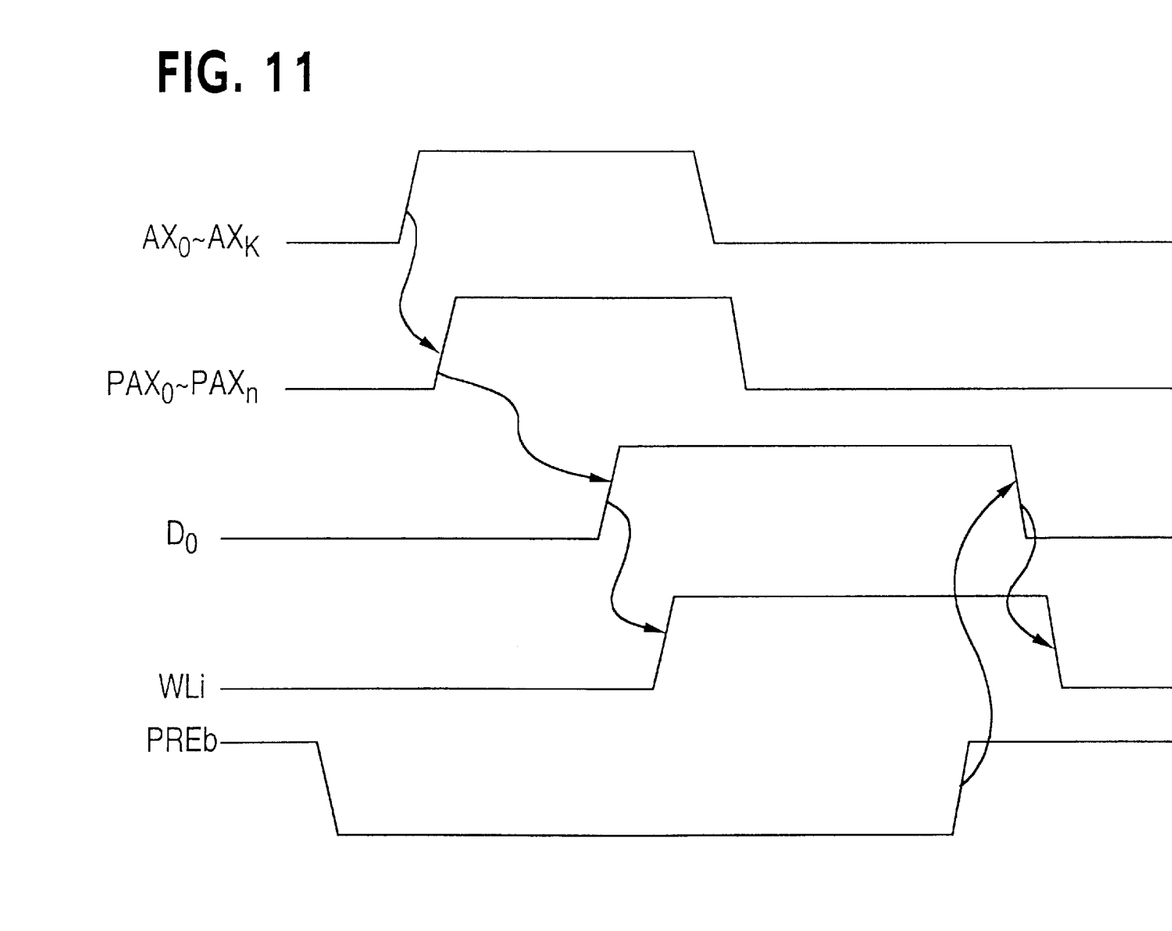
FIG. 11 is a signal diagram of a row address decode circuit.

FIG. 10 is a circuit diagram of a row address decode circuit 1000 which performs the wafer burn-in test, and FIG. 11 is an operational waveform diagram of the same. This row address decode circuit has a pre-decode circuit 10, a decode circuit 20, and a word driver circuit 30.

The pre-decode circuit 10 has parallel inverters $11_0 \sim 11_n$, NAND gates $12_0 \sim 12_n$, and NAND gates $13_0 \sim 13_n$. Address signals $AX_0 \sim AX_k$, Inverted address signals $AX_{0b} \sim AX_{kb}$, are inputted to the NAND gates $12_0 \sim 12_n$. Wafer burn-in signal WBI is inputted to the inverters $11_0 - 11_n$. The output signals of the NAND gates $12_0 - 12_n$ and the inverters $11_0 - 11_n$ are respectively inputted to the NAND gates $13_0 - 13$. This pre-decode circuit 10 outputs pre-decodes signal $PAX_0 \sim PAX_n$ of (n+1) bits. Half of k+1 is n+1 in this circuit.

The least significant address signal $AX_0$ or $AX_{0b}$, which is the inverted signal of $AX_0$, is inputted to one input terminal of the NAND gate $12_0$, and second to least significant address signal $AX_1$ or $AX_{1b}$, which is the inverted signal of $AX_1$, is inputted to another input terminal of NAND gate $12_0$. The third to least significant address signal $AX_2$ or $AX_{2b}$, which is the inverted signal of $AX_2$, is inputted to one input terminal of the NAND gate $12_1$, and fourth to least significant address signal $AX_3$ or $AX_{3b}$, which is the inverted signal of $AX_3$, is inputted to another input terminal of NAND gate $12_1$. Input signals are applied to all other NAND gates $12_2 - 12_n$ in the same manner as described above. The NAND gates $12_0 \sim 12_n$ output a logic "L" level only when both input signals are a logic "H" level.

When the wafer burn in signal WBI is L level (ground potential), which designates a disable state, the memory circuit operates in a normal mode. Nodes $NI_0 \sim NI_n$ are an H level (power supply potential). Therefore, the output signals of NAND gates $13_0 \sim 13_n$ depend on the output signals of NAND gates $12_0 \sim 12_n$. NAND gates $13_0 \sim 13_n$ output a logic L level when the output signal of NAND gates $12_0 \sim 12_n$ is a logic H level.

When the wafer burn in signal WBI is an H level, which designates an enable state, the memory circuit operates in a burn-in test mode. Nodes $NI_0 \sim NI_n$ are L level. Therefore, all of the NAND gates $13_0 \sim 13_n$ output a logic H level.

Decode circuit 20 has a P channel MOS transistor 21, an N channel MOS transistors $22_0 \sim 22_n$, and an inverter 23. Pre-decode signals $PAX_0 \sim PAX_n$ and a reset signal PREb are inputted to the decode circuit 20. The reset signal PREb become an L level when the decode circuit 20 is reset, and the reset signal PREb become an H level when the decode circuit 20 is in an enable state. NMOS transistors $22_0 \sim 22_n$ are connected in series. The source of $22_n$ is connected to the ground level. The drain of the NMOS transistor $22_0$ is connected to the node $ND_0$. Pre-decode signals $PAX_0 \sim PAX_n$ are inputted to the gates of transistor $22_0 \sim 22_n$, respectively. The source of PMOS transistor 21 is connected to the power supply potential, and the drain is connected to the node $ND_0$. The reset signal PREb is inputted to the gate of PMOS transistor 21. The node $ND_0$ is connected to the input terminal of the inverter 23. The inverter 23 outputs a decode signal $D_0$.

When the decode circuit is reset, reset signal PREb and all of the address signals $AX_0 \sim AX_n$ become an L level. Therefore, pre-decode signals $PAX \sim PAX_n$ become an L level. PMOS transistor 21 is in an on state, and the NMOS transistors $22_0 \sim 22_n$ are in off state 20 in this case. The node $ND_0$ becomes an H level, and the decode signal $D_0$ becomes an L level.

When the decode line is activated, reset signal PREb becomes an H level. The PMOS transistor 21 is in an off state in this case. Address signals $AX_0 \sim AX_k$ are inputted to the pre-decode circuit 10. Pre-decode circuit 10 outputs pre-decode signals $PAX_0 \sim PAX_n$. If all of the pre-decode signals $PAX_0 \sim PAX_n$ are an H level, all of the NMOS transistor $22_0 \sim 22_n$ are in an on state. Therefore, the node $ND_0$ becomes an L level, and the decode signal $D_0$ becomes an H level. If one of the pre-decode signals $PAX_0 \sim PAX_n$ is an L level, one of the NMOS transistor $22_0 \sim 22_n$ is in an off state. Therefore, the node $ND_0$ keeps an H level.

When the wafer burn in test is performed, all of the pre-decode signals $PAX_0 \sim PAX_n$ become an H level. Therefore, the decode signal $D_0$ is an H level during the wafer burn in test.

The word driver circuit 30 has an inverter 31, level shift circuit 32, PMOS transistor 33, and NMOS transistor 34. The level shift circuit changes the amplitude of the input signal. The input signal has an amplitude between the power supply potential and the ground potential. However, to activate a word line, a slightly high level than power supply potential is needed. This level is called the word line activate potential. Therefore, the level shift circuit is needed. The output terminal of the level shift circuit is connected to the gates of PMOS transistor 33 and NMOS transistor 34. The source of PMOS transistor 33 is connected to the word line activate potential. The source of the NMOS transistor is connected to the ground potential. The drains of transistors 33 and 34 are connected to a word line WLi.

When the decode signal $D_0$ is an L level, the word driver circuit makes the word line WLi the ground potential. When the decode signal $D_0$ is an H level, the word driver circuit makes the word line WLi word line an activate potential.

FIG. 10 shows one row address decode circuit. A memory circuit has a plurality of row address decode circuits. For example, address signals inputted to NAND gate $12_0$ have four patterns. The first pattern is that the inputted signals are $AX_0$ and $AX_1$. The second pattern is that the inputted signals are $AX_{0b}$ and $AX_1$. The third pattern is that the inputted signals are $AX_0$ and $AX_{1b}$. The fourth pattern is that the inputted signals are $AX_{0b}$ and $AX_{1b}$. The same relationship applies to other NAND gates $12_1 - 12_n$. Therefore, there are $4^{(n+1)}$ units of row address decode circuits and word lines in a memory circuit.

In the prior art, only the selected word line is activated during the normal mode, and all of the word lines are activated during the wafer burn-in test mode.

While the wafer burn in test is performed, there is not any electrical potential difference between the word lines. However, in the normal operation, there are electrical potential differences between the word lines. Therefore, the wafer burn-in test in the prior art can not test for the stress between word lines.

SUMMARY OF THE INVENTION

An object of the present invention is to provide a semiconductor memory device which allows stress acceleration testing between word lines.

A memory circuit includes a plurality of word lines connected to a plurality of memory cells and a plurality of row address decode circuits which selectively activate the plurality of word lines, respectively, and each having at least one address input terminal, a first terminal which receives a first wafer burn-in signal, and a terminal which receives a second wafer burn-in signal.

wherein the row address decode circuits activate all of the word lines when the first wafer burn-in signal and the second wafer burn-in signal are in an enable state, wherein the row address decode circuits activate a subset of the word lines when the second wafer burn-in signal is enable state and the first wafer burn-in signal is in a disable state.

BRIEF DESCRIPTUON OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 2:
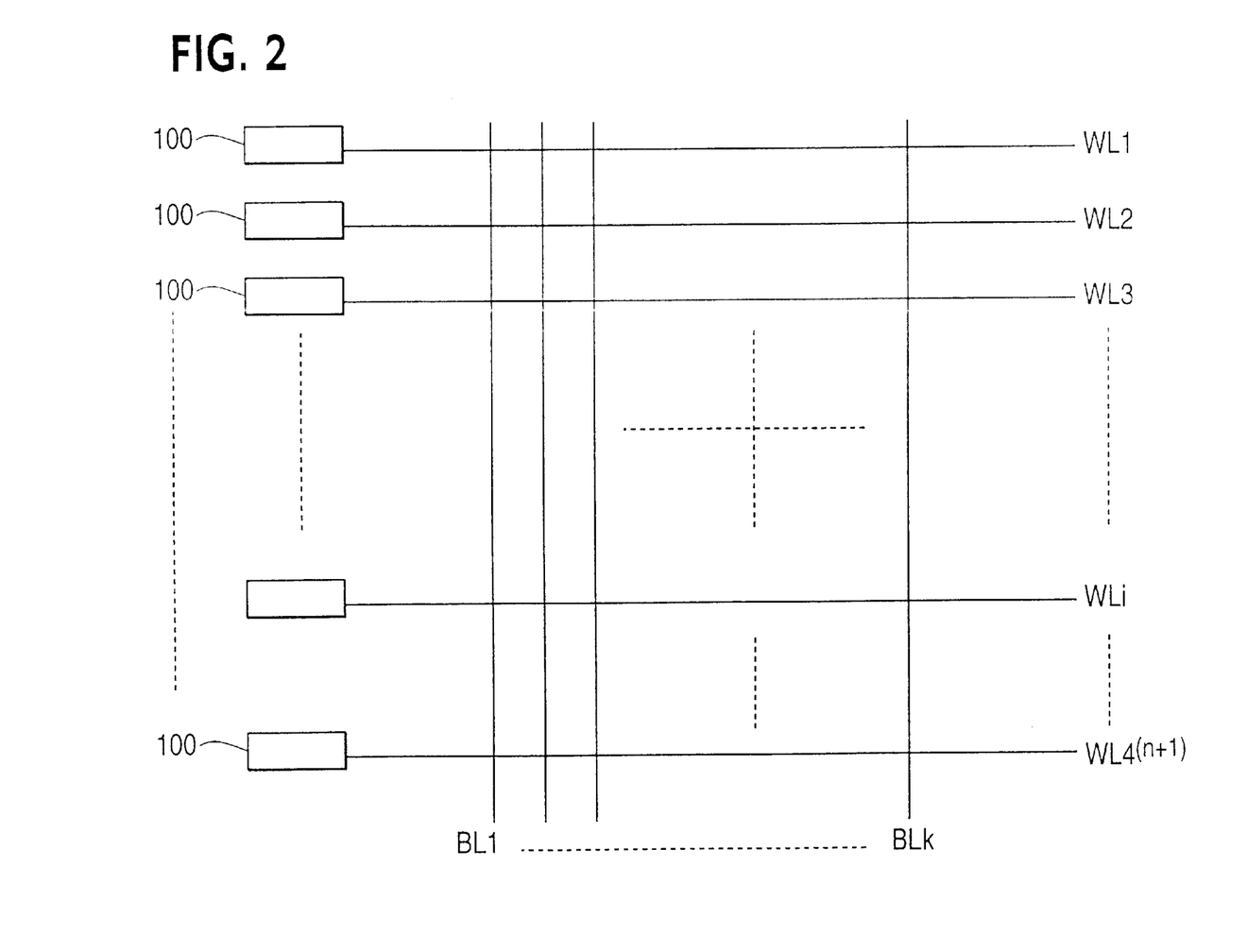
FIG. 2 is a schematic diagram of a memory circuit of the invention.

The memory circuit of this embodiment has a plurality of word lines and a plurality of bit lines. Word lines Wli (i=1,2,3 . . . ) and bit lines BLj are disposed like a matrix. A plurality of row address decode circuits 100 are connected to each word line as shown in FIG. 2.

Figure 1:
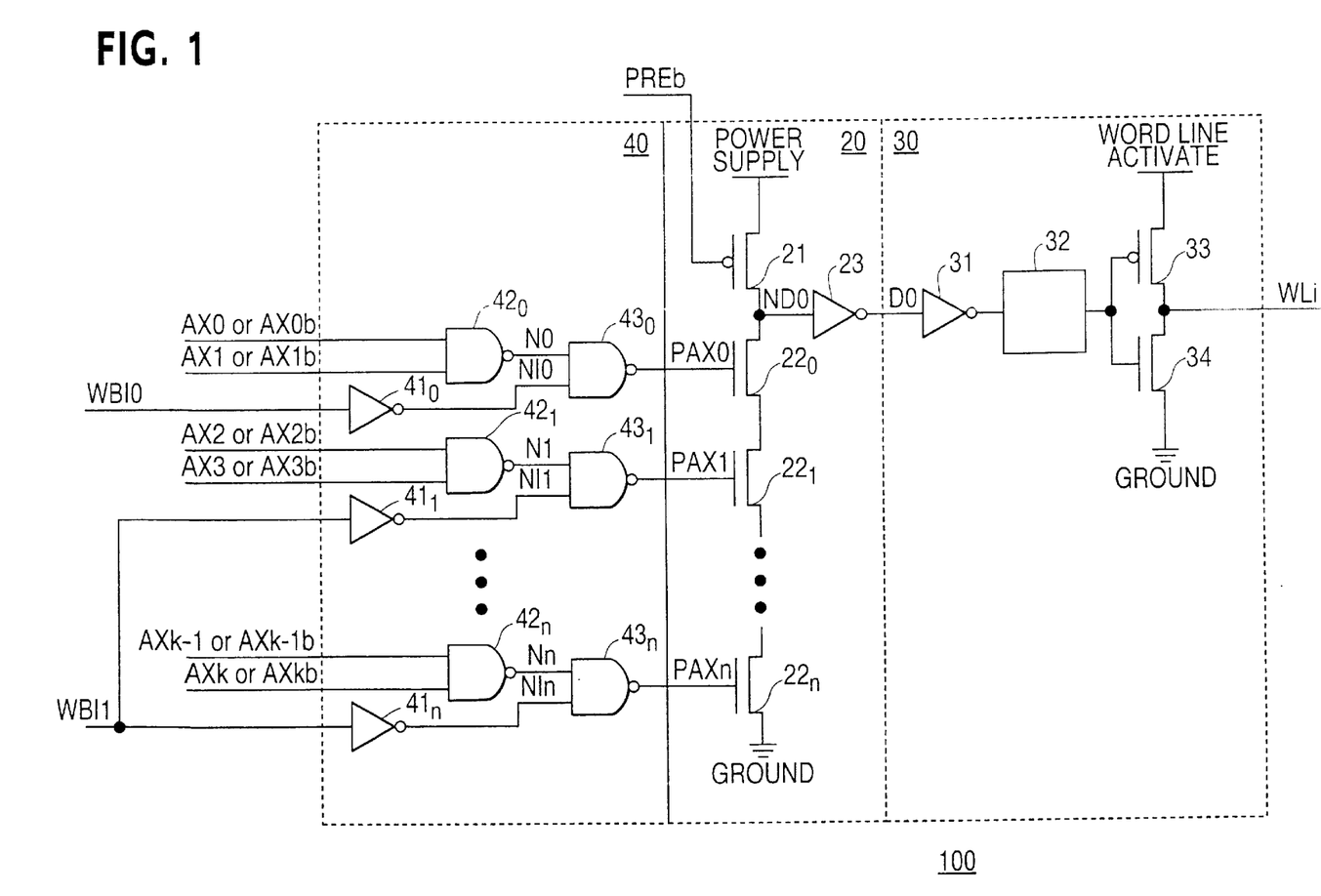
FIG. 1 is a circuit diagram of a row address decode circuit of a first embodiment of the present invention.

FIG. 1 is a circuit diagram that shows a row address decode circuit 100 of a first embodiment of the present invention. This row address decode circuit has a pre-decode circuit 40, a decode circuit 20, and a word driver circuit 30. FIG. 1 shows only one row address decode circuit. A memory circuit has a plurality of row address decode circuits. This row address decode circuit 100 has two modes of the wafer burn-in test.

The pre-decode circuit 40 has parallel inverters $41_0 \sim 41_n$, NAND gates $42_0 \sim 42_n$, and NAND gates $43_0 \sim 43_n$. Address signals $AX_0 \sim AX_k$ and inverted address signals $AX_{0b} \sim AX_{kb}$, are inputted to the NAND gates $42_0 \sim 42_n$. In this embodiment, a first wafer burn-in signal WBI0 is inputted to the inverter $41_0$, and a second wafer burn-in signal WBI1 is inputted to the inverters $41_0 \sim 41_n$. The output signals of the NAND gates $42_0 \sim 42_n$ and the inverters $41_0 \sim 41_n$ are inputted to the NAND gates $43_0 \sim 43_n$ respectively. This pre-decode circuit 40 outputs pre-decode signal $PAX_0 \sim PAX_n$ of (n+1) bits. Half of k+1 is n+1 in this circuit.

The least significant address signal $AX_0$ or $AX_{0b}$, which is the inverted signal of $AX_0$, is inputted to one input terminal of the NAND gate $42_0$, and second to least significant address signal $AX_1$ or $AX_{1b}$, which is the inverted signal of $AX_1$, is inputted to another input terminal of NAND gate $42_0$. The third to least significant address signal $AX_2$ or $AX_{2b}$, which is the inverted signal of $AX_2$, is inputted to one input terminal of the NAND gate $42_1$, and third to least significant address signal $AX_3$ or $AX_{3b}$, which is the inverted signal of $AX_3$, is inputted to another input terminal of NAND gate $42_1$. The relationship of input signals to all other NAND gates $42_2 \sim 42_n$ are the same as described above. NAND gates $42_0 \sim 42_n$ output a logic L level only when both of the input signals are a logic H level.

Both wafer burn-in signals are set to the L level during normal mode. While both wafer burn-in signals WBI0 and WBI1 are the L level (ground potential), nodes $NI_0 \sim NI_n$ are H level (power supply potential). Therefore, the output signals of NAND gates $43_0 \sim 43_n$ depend on the output signals of NAND gates $42_0 \sim 42_n$. NAND gates $43_0 \sim 43_n$ output the logic L level when output signals of NAND gates $42_0 \sim 42_n$ are the logic H level. NAND gates $43_0 \sim 43_n$ output the logic L level when output signals of NAND gates $42_0 \sim 42_n$ are the logic H level. A pre-decode circuit 40 operates according to address signals $AX_0 \sim AX_k$. Therefore, only the selected word line is raised to a predetermined potential (word line activate potential) in the normal mode.

Both wafer burn-in signals WBI0 and WBI1 are set to the H level during first burn-in test mode. While the Wafer burn-in signals WBI0 and WBI1 are the H level, nodes NI0~NIn are the L level. Therefore, all of the NAND gates $43_0 \sim 43_n$ output a logic H level. All word lines are activated and raised to a predetermined potential in the first burn-in test mode.

The first burn-in signal WBI0 is set to the L level, and the second burn-in signal is set to the H level during the second burn-in test mode. While the wafer burn-in signal WBI1 is the H level, nodes NI1~NIn are the L level. Therefore, the NAND gates $43_1 \sim 43_n$ output a logic H level. The output signals of the NAND gates $43_0$ depend on the output signals of NAND gates $42_0$.

There are four patterns of signal combination inputted to the NAND gate $42_0$. The first pattern is $AX_0$ and $AX_1$, the second pattern is $AX_{0b}$ and $AX_1$, the third pattern is $AX_0$ and $AX_{1b}$, and the fourth pattern is $AX_{0b}$ and $AX_{1b}$. There is at least one combination that makes the NAND gate $42_0$ output a signal of an L level. Therefore, one fourth of pre-decode circuits 40 output pre-decode signal $PAX_0$ of the H level. One fourth of the word lines are raised to a predetermined level.

Decode circuit 20 has a P channel MOS transistor 21, N channel MOS transistors $22_0$~$22_n$, and an inverter 23. Pre-decode signals $PAX_0$~$PAX_n$ and a reset signal PREb are inputted to the decode circuit 20. The reset signal PREb becomes the L level when the decode circuit 20 is reset, and the reset signal PREb becomes the H level when the decode circuit 20 is in the enable state. NMOS transistors $22_0$~$22_n$ are connected in series. The source of NMOS transistor $22_n$ is connected to the ground potential. The drain of the NMOS transistor $22_n$ is connected to the node ND0. Pre-decode signals $PAX_0$~$PAX_n$ are inputted to the gates of transistor $22_0$~$22_n$, respectively. The source of PMOS transistor 21 is connected to the power supply potential, and the drain is connected to the node ND0. The reset signal PREb is inputted to the gate of PMOS transistor 21. The node ND0 is connected to the input terminal of the inverter 23. The inverter 23 outputs a decode signal D0.

When the decode circuit is reset, reset signal PREb and all of the address signals AX0–Axn become the L level. Therefore, pre-decode signals $PAX_0$~$PAX_n$ become the L level. PMOS transistor 21 is in an on state, and the NMOS transistors 220–22n are in an off state in this case. The node ND0 becomes the H level, and the decode signal D0 is L level, which means disable state.

When the decode circuit is activated in the normal mode, reset signal PREb becomes the H level. The PMOS transistor 21 is in an off state in this case. Address signals $AX_0$~$AX_k$ are inputted to the pre-decode circuit 40. Pre-decode circuit 40 outputs pre-decode signals $PAX_0$~$PAX_n$. If all of the pre-decode signals $PAX_0$~$PAX_n$ are the H level, all of the NMOS transistor $22_0$~$22_n$ are in the on state. Therefore, the node ND0 becomes the L level, and the decode signal D0 becomes the H level, which means enable state. If one of the pre-decode signals $PAX_0$~$PAX_n$ is the L level, one of the NMOS transistor $22_0$~$22_n$ is in the off state. Therefore, the node ND0 keeps the H level.

When the first mode of wafer burn-in test is performed, all of the pre-decode signals $PAX_0$~$PAX_n$ become the H level. Therefore, the decode signal $D_0$ is the H level during the first wafer burn in test.

When the second mode of wafer burn-in test is performed, all of the pre-decode signals $PAX_1$~$PAX_n$ become the H level. Also, one-fourth of the pre-decode signals $PAX_0$ become the H level. As described above, there is at least one combination that makes the NAND gate $42_0$ output a signal of the L level. Therefore, one fourth of pre-decode circuits 40 output pre-decode signal $PAX_0$ of the H level. One-fourth of the word lines are raised to a predetermined level.

Therefore, one-forth of the decode signals D0 are the H level during the second wafer burn-in test.

The word driver circuit 30 has an inverter 31, a level shift circuit 32, a PMOS transistor 33, and a NMOS transistor 34. The level shift circuit changes the amplitude of the input signal. The input signal has an amplitude between the power supply potential and the ground potential. However, to activate a word line, a slightly higher level than the power supply potential is needed. This is called the word line activate potential. Therefore, the level shift circuit is needed. The output terminal of the level shift circuit is connected to the gates of PMOS transistor 33 and NMOS transistor 34. The source of PMOS transistor 33 is connected to the word line activate potential. The source of the NMOS transistor is connected to the ground potential. The drains of transistors 33 and 34 are connected to a word line WL1.

When the decode signal $D_0$ is the L level, the word driver circuit 30 makes the word line WLi the ground potential. When the decode signal $D_0$ is the H level, word driver circuit makes the word line WLi word line the activate potential.

As described above, address signals inputted to NAND gate $42_0$ have four patterns. The same relationship applies to other NAND gates $42_1$–$42_n$. Therefore, there are $4^{(n+1)}$ units of row address decode circuits and word lines in a memory circuit.

Figure 3:
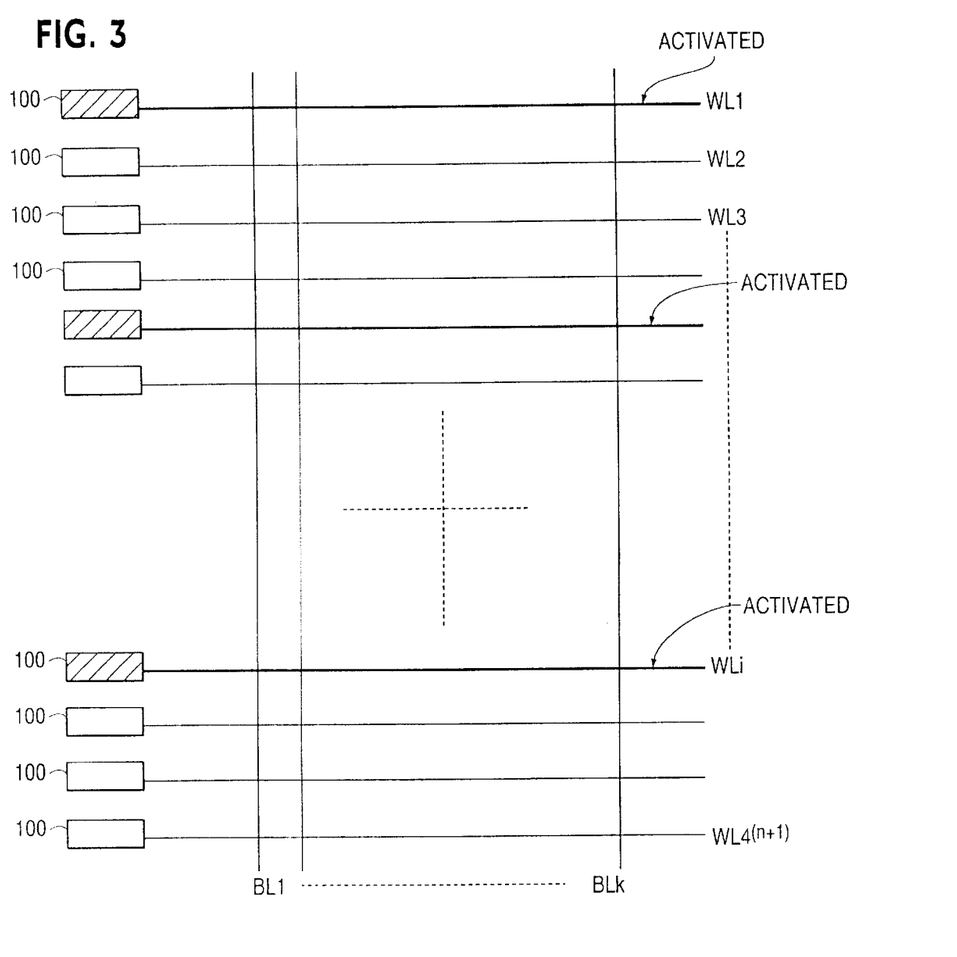
FIG. 3 shows activated word lines of the first embodiment.

In this embodiment, there are two wafer burn-in test modes. One-fourth of the word lines are raised to a predetermined level during the second burn in test mode. FIG. 3 schematically shows activated word lines in the second wafer burn-in test mode.

Therefore, the test can be performed in a state, which there are electrical potential differences between word lines, in addition to the prior wafer burn-in test. Also, there is no need to add another device to achieve this embodiment.

Figure 4:
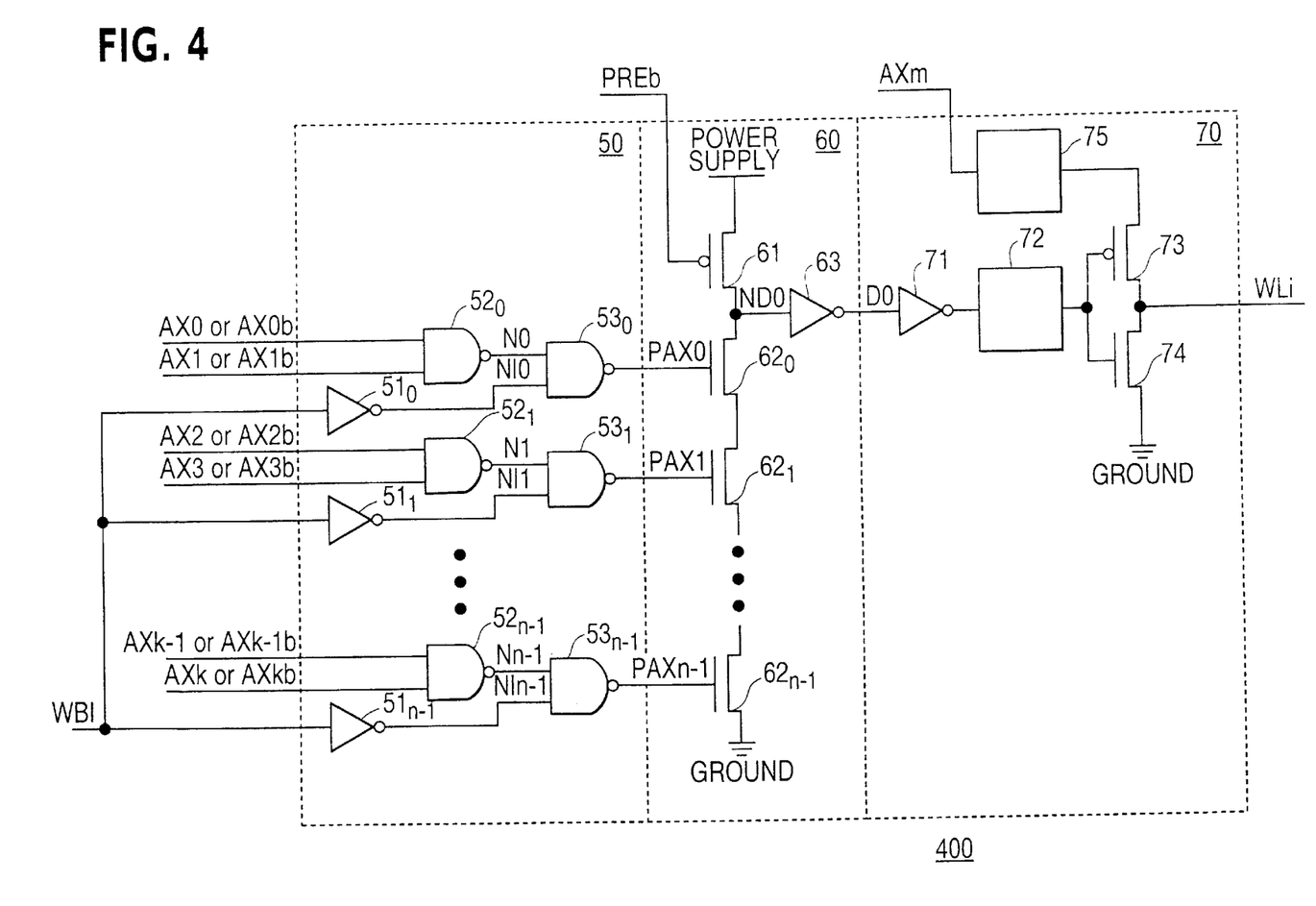
FIGS. 4 and 5 are a circuit diagrams of a row address decode circuit of the second embodiment of the present invention.
Figure 5:
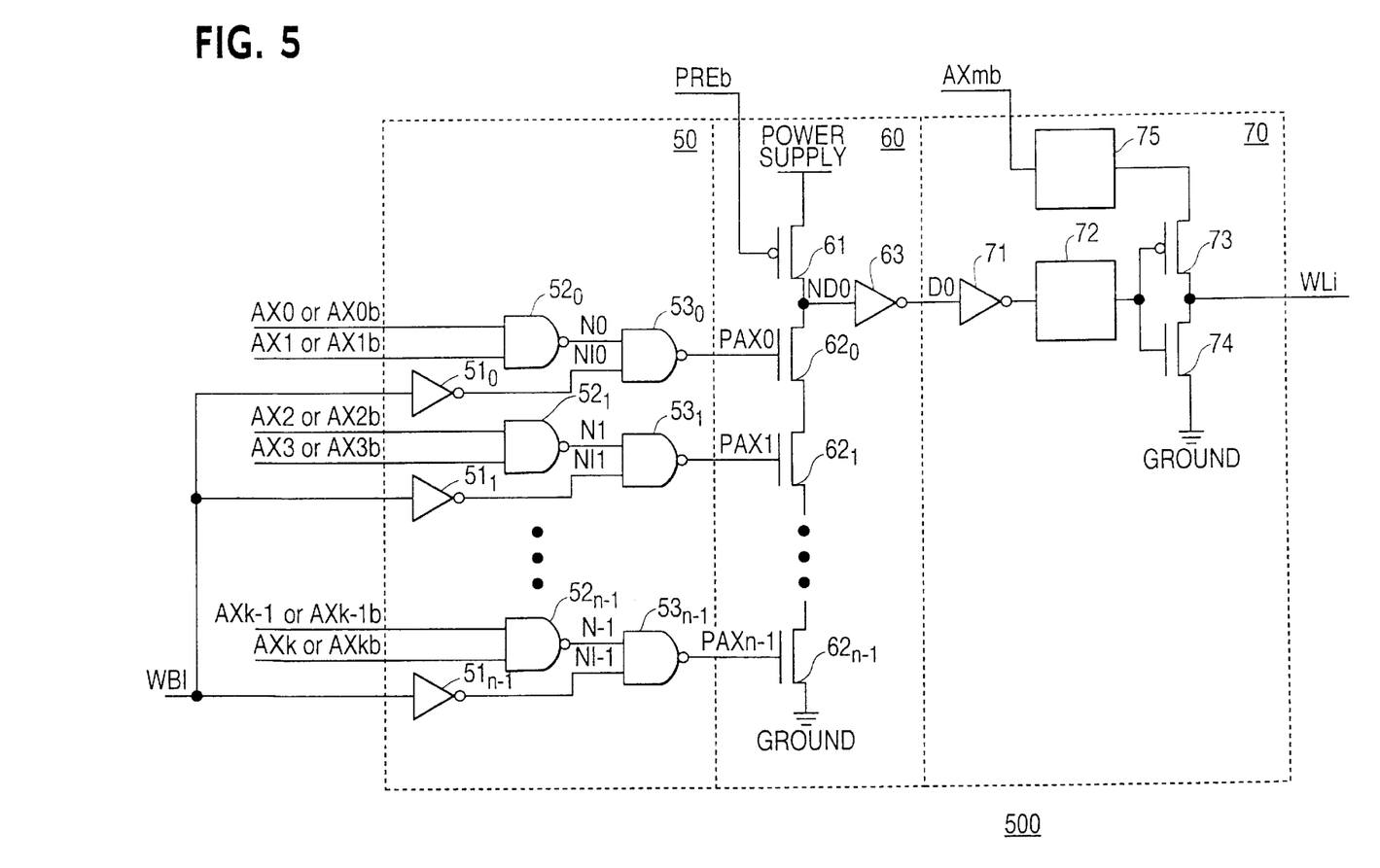

FIGS. 4 and 5 are circuit diagrams of row address decode circuits 400 and 500 for performing wafer burn-in test in the second embodiment. These row address decode circuits have a pre-decode circuit 50, a decode circuit 60, and a word driver 70. The predetermined bit $AX_m$ of the address signals is inputted to the first row address decode circuit 400, as shown in FIG. 4. The inverted signal $AX_{mb}$ of the predetermined bit is its inputted to second row address circuit 500. These row address decode circuits are the same except for the address signal that is inputted to the word driver circuit 70.

The row address decode circuit is described below with reference to FIG. 4.

The pre-decode circuit 50 has parallel inverters $51_0$~$51_{n-1}$, NAND gates $52_0$~$52_{n-1}$, and NAND gates $53_0$~$53_{n-1}$. Address signals $AX_0$~$AX_k$ and inverted address signals $AX_{0b}$~$AX_{kb}$, are inputted to the NAND gates $52_0$~$52_{n-1}$. However, in this embodiment, a predetermined bit of the address signal $AX_m$ and $AX_{mb}$ are not inputted to the NAND gates $52_0$~$52_{n-1}$.

Wafer burn-in signal WBI is inputted to the inverters $51_0$~$51_{n-1}$. The output signals of the NAND gates $52_0$~$52_{n-1}$ and the inverters $51_0$~$51_{n-1}$ are inputted to the NAND gates $53_0$~$53_{n-1}$, respectively. This pre-decode circuit 50 outputs the pre-decode signal $PAX_0$~$PAX_{n-1}$ of n bits. Half of k is n in this circuit.

The least significant address signal $AX_0$ or $AX_{0b}$, which is the inverted signal of $AX_0$, is inputted to one input terminal of the NAND gate $52_0$, and the second to least significant address signal $AX_1$ or $AX_{1b}$, which is the inverted signal of $AX_1$, is inputted to another input terminal of NAND gate $52_0$. The third to least significant address signal $AX_2$ or $AX_{2b}$, which is the inverted signal of $AX_2$, is inputted to one input terminal of the NAND gate $52_1$, and the fourth to least significant address signal $AX_3$ or $AX_{3b}$, which is the inverted signal of $AX_3$, is inputted to another input terminal of NAND gate $52_1$. The relationship of input signals to all other NAND gates $52_2$–$52_{n-1}$ are the same as described above except for skipping the address signal $AX_m$. NAND gates $52_0$–$52_{n-1}$ output a logic L level only when both of input signals are a logic H level.

When the wafer burn-in signal WBI is the L level (ground potential) which means disable state, nodes $NI_0$~$NI_{n-1}$ are the H level (power supply potential). Therefore, the output signals of NAND gates $53_0$–$53_{n-1}$ depend on the output signals of NAND gates $52_0$–$52_{n-1}$. NAND gates $53_0$–$53_{n-1}$ output a logic L level when output signals of NAND gates $52_0$–$52_{n-1}$ are a logic H level. NAND gates $53_0$–$53_{n-1}$ output a logic H level when output signals of NAND gates $52_0$–$52_{n-1}$ are a logic L level.

When the wafer burn in signal WBI is the H level, which means enable state, nodes $NI_0 \sim NI_{n-1}$ are the L level. Therefore, NAND gates $53_0$–$53_{n-1}$ output a logic H level.

Decode circuit 60 has a P channel MOS transistor 61, N channel MOS transistors $62_0$–$62_{n-1}$, and an inverter 63. The operation of the decode circuit 60 is the same as the operation of the first embodiment.

The word driver circuit 70 has an inverter 71, a first level shift circuit 72, a PMOS transistor 73, an NMOS transistor 74, and a second level shift circuit 75. The level shift circuits 72 and 75 change the amplitude of inputted signal. The input signal has amplitude between the power supply potential and the ground potential. However, to activate a word line, a slightly high potential than the power supply potential is needed. Therefore, the level shift circuits are needed. The output terminal of the first level shift circuit is connected to the gates of PMOS transistor 73 and NMOS transistor 74. The output terminal of the second level shift circuit 75 is connected to the source of PMOS transistor 73. The source of the NMOS transistor 74 is connected to the ground potential. The drains of transistors 73 and 74 are connected to a word line WLi. The address signal $AX_m$ ($AX_{mb}$ in FIG. 5) is inputted to the level shift circuit 75 in this embodiment.

When both the decode signal $D_0$ and the address signal $AX_m$ are the H level, the word driver circuit 70 raises a potential of the word line WLi. When the address signal $AX_m$ is the L level, the word line WLi is not so raised, even if the decode signal the $D_0$ is H level.

On the other hand, the row address decode circuit as shown in FIG. 5 raises the potential of the word line WLi to the word line activate potential, when both the decode signal $D_0$ and the address signal $AX_{mb}$ are the H level. When the address signal $AX_{mb}$ is the L level, the word line WLi is not raised, even if the decode signal $D_0$ is H the level.

Figure 6:
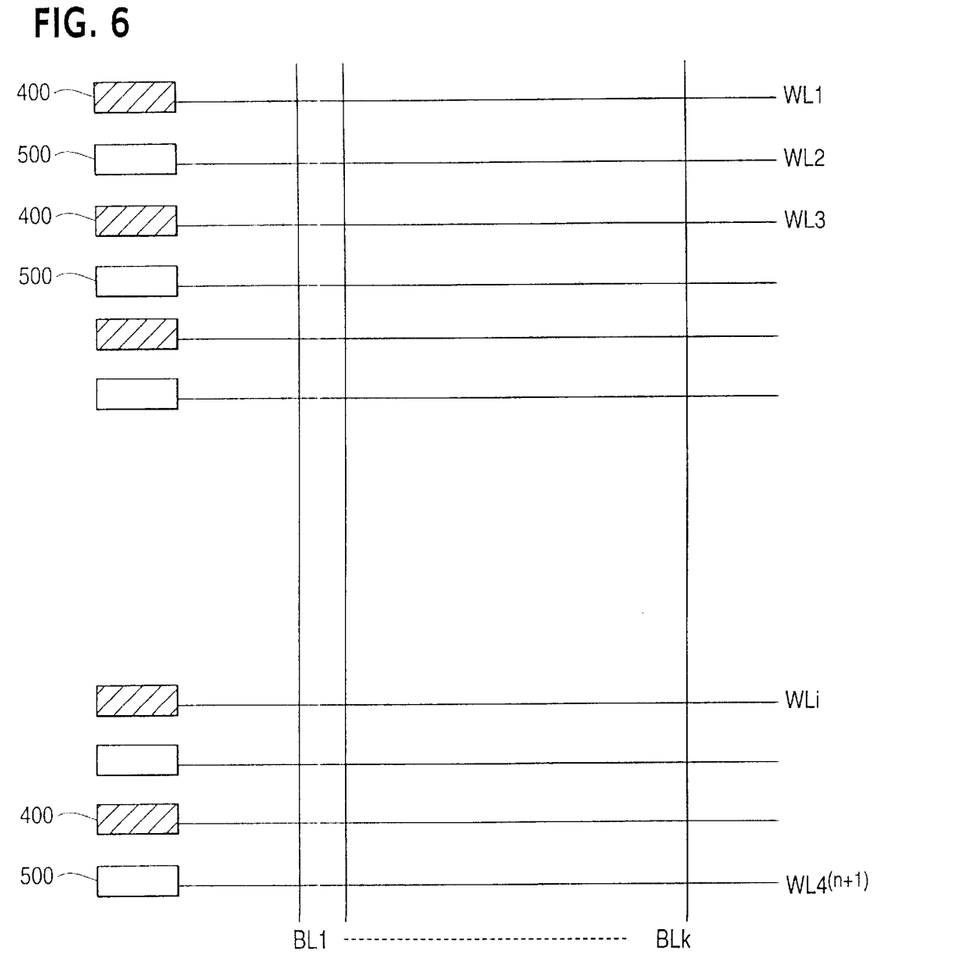
FIG. 6 shows a disposition of a first row address decode circuit and a second row address decode circuit of the second embodiment.

The first row address decode circuit and the second row address decode circuit are alternatively arranged as shown in FIG. 6.

The selected word line is activated during the normal mode. While the wafer burn-in test is performed, half of the word lines are activated because the row address decode circuit 400 and 500 are alternatively arranged. The time needed to test for stress between word lines becomes shorter than that of the first embodiment.

Figure 7:
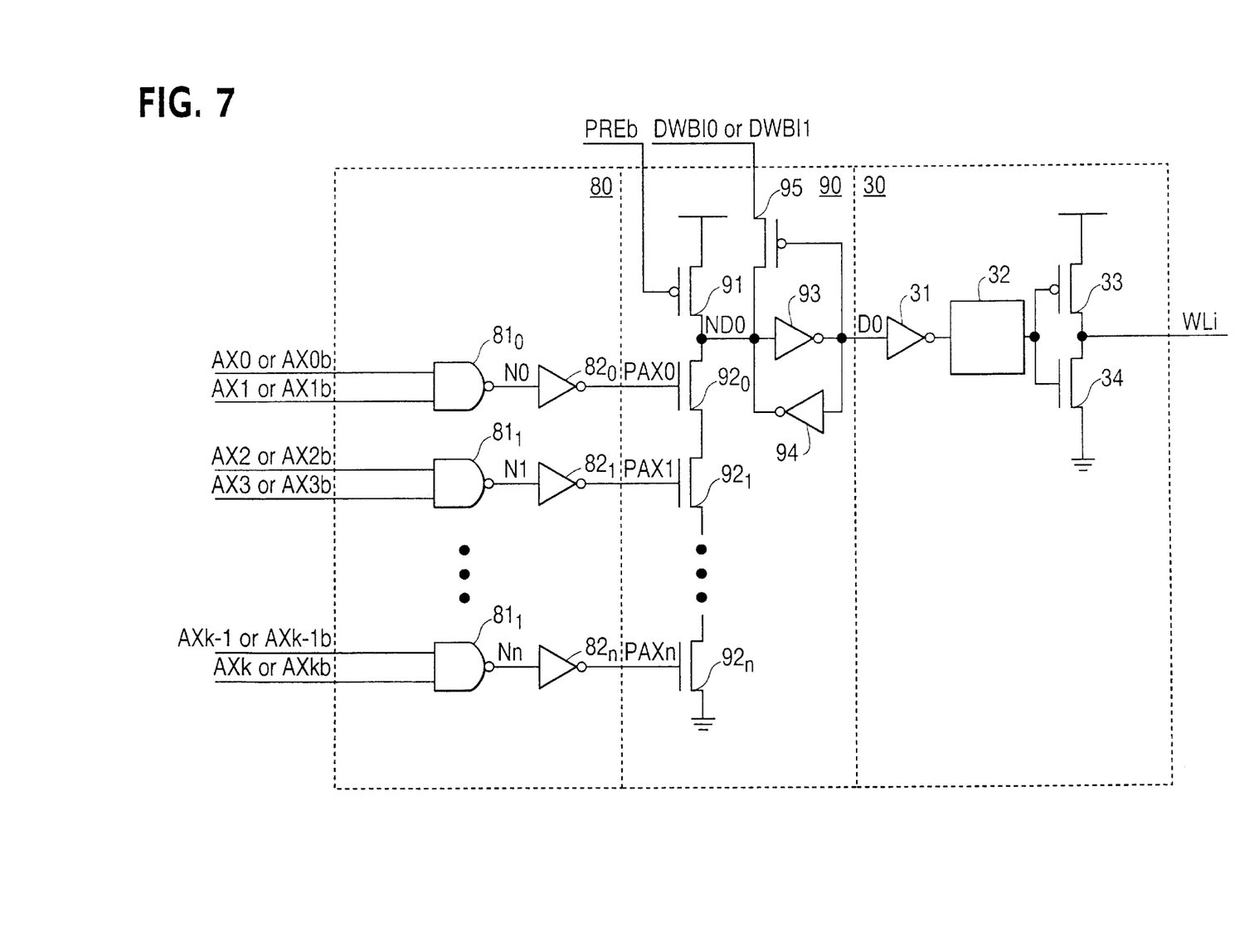
FIG. 7 is a circuit diagram of a row address decode circuit of a third embodiment of the present invention.

FIG. 7 is a schematic diagram that shows a row address decode circuit 700 of a third embodiment of the present invention. This row address decode circuit has a pre-decode circuit 80, a decode circuit 90, and a word driver 30. FIG. 7 shows only one row address decode circuit. A memory circuit has a plurality of first and second row address decode circuits. This row address decode circuit has two modes of wafer burn-in test. A first wafer burn-in signal DWB0 is inputted to the first row address decode circuits. A second wafer burn-in signal is inputted to second the row address circuits. These row address decode circuits are the same except for the wafer burn-in signals that are inputted to the decode circuit 90.

The pre-decode circuit 80 has NAND gates $81_0$–$81_n$, and inverters $82_0$–$82_n$. Address signals $AX_0 \sim AX_k$, and inverted address signals $AX_{0b} \sim AX_{kb}$, are inputted to the NAND gates $81_0$–$81_n$. In this embodiment, this pre-decode circuit 80 outputs pre-decode signal $PAX_0 \sim PAX_n$ of (n+1) bits. Half of k+1 is n+1 in this circuit.

The least significant address signal $AX_0$ or $AX_{0b}$, which is the inverted signal of $AX_0$, is inputted to one input terminal of the NAND gate $81_0$, and the second to least significant address signal $AX_1$ or $AX_{1b}$, which is the inverted signal of $AX_1$, is inputted to another input terminal of NAND gate $81_0$. The third to least significant address signal $AX_2$ or $AX_{2b}$, which is the inverted signal of $AX_2$, is inputted to one input terminal of the NAND gate $81_1$, and the third to least significant address signal $AX_3$ or $AX_{3b}$, which is the inverted signal of $AX_3$, is inputted to another input terminal of NAND gate $81_1$. The relationship of input signals to all other NAND gates $81_2 \sim 81_n$ are the same as described above. NAND gates $81_0 \sim 81_n$ output a logic L level only when both of input signals are a logic H level.

Decode circuit 90 has a P channel MOS transistor 91, N channel MOS transistors $92_0 \sim 92_n$, and an inverter 93. Pre-decode signals $PAX_0 \sim PAX_n$ and a reset signal PREb are inputted to the decode circuit 90. The reset signal PREb becomes the L level when the decode circuit 90 is reset, and the reset signal PREb becomes the H level when the decode circuit 90 is in an enable state. NMOS transistors $92_0 \sim 92_n$ are connected in series. The source of $92_n$ is connected to the ground level. The drain of the NMOS transistor $92_0$ is connected to the node $ND_0$. Pre-decode signals $PAX_0 \sim PAX_n$ are inputted to the gates of transistor $92_0 \sim 92_n$, respectively. The source of the PMOS transistor 91 is connected to the power supply potential, and the drain is connected to the node $ND_0$. The reset signal PREb is inputted to the gate of the PMOS transistor 91. The node $ND_0$ is connected to the input terminal of the inverter 93. The inverter 93 outputs a decode signal $D_0$.

The decode circuit 90 also has an inverter 94 and P channel MOS transistor 95. The input terminal of the inverter 94 is connected to the output terminal of the inverter 93. The output terminal of the inverter 94 is connected to the node $ND_0$. The drain of P channel MOS transistor 95 is connected to the node $ND_0$. The gate of P channel MOS transistor 95 is connected to the output terminal of the inverter 93. Either first wafer burn-in signal DWBI0 or second wafer burn-in signal DWBI1 is inputted to the source of P channel MOS transistor 95. These wafer burn-in signals are set to the H level during the normal mode, and set to the L level during the wafer burn-in test. First wafer burn-in signal DWBI0 and second wafer burn-in signal WBI1 are independent signals. DWBI0 is inputted to the decode circuit 90 of the first row address decode circuits. Second wafer burn-in signal DWBI1 is inputted to the second decode circuits 90. The ability to make an electric current of the transistor 95 and the inverter 94 is less than that of transistors $92_0 \sim 92_n$.

The word driver circuit 30 is the same as that of first embodiment.

The operation of the row address decode circuit 700 is described below.

The pre-decode circuit 80 outputs pre-decode signals PAX0~PAXn according to the address signal $AX_0 \sim AX_n$ during the normal mode and the wafer burn-in mode. Wafer burn-in signals DWBI0 and DWBI1 are to the set H level during the normal operation. Therefore, only the selected word line is raised to the word line activate potential during the normal mode.

Figure 8:
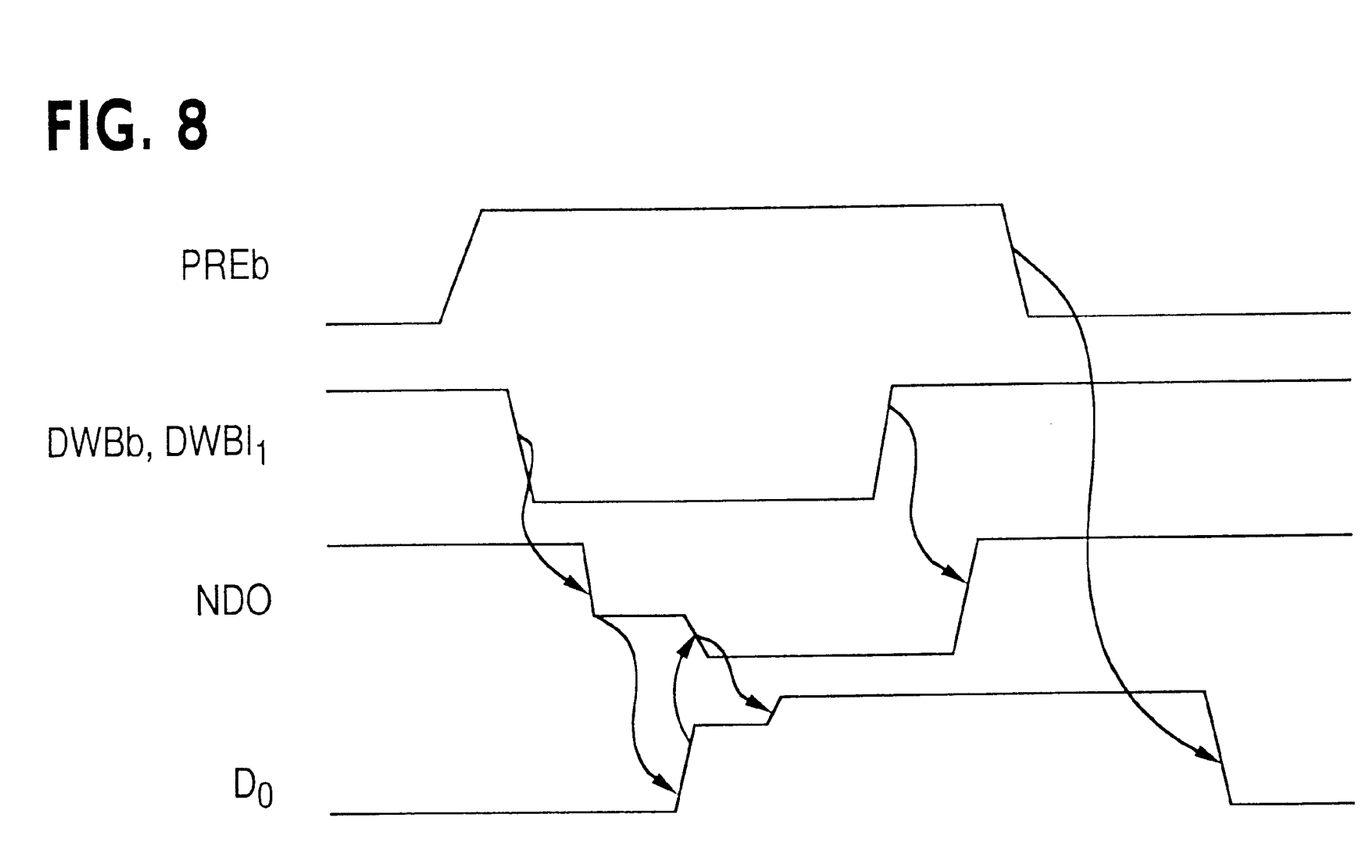
FIG. 8 is a signal diagram of the row address decode circuit of the third embodiment.

When the wafer burn-in signal DWBI0 (or DWBI1) is set to the L level in the test mode, the potential of node $ND_0$ starts to drop with no relationship to the pre-decode signals $PAX_0 \sim PAX_n$. Therefore, the decode signal $D_0$ starts to rise. When the potential of the decode signal exceeds the threshold voltage of the P channel MOS transistor 95, the P channel MOS transistor 95 becomes the off state. However, the potential of node $ND_0$ is kept at the L level due to inverter 93 and inverter 94. The decode signal keeps the H level, and the word line WL1 is raised to the word line activate potential. For example, when the first wafer burn-in signal DWBI0 is set to the L level, all of the first row address decode circuits raise the word lines to the word line activate potential. When the second wafer burn-in signal DWBI1 is set to the L level, all of the second row address decode circuits raise the word lines to the word line activate potential. FIG. 8 schematically shows the operation signals described above.

The row address decode circuits, having a first wafer burn in signal input, and the row address decode circuits, having a second wafer burn-in signal input, are alternatively arranged. Therefore, the test can be performed in the state where there are electrical potential differences between word lines. Also, the wafer burn-in test of the prior art can be performed by controlling the timings of the wafer burn-in signals.

What is claimed is:

1. A memory circuit comprising:

a plurality of word lines connected to a plurality of memory cells; and a plurality of row address decode circuits which selectively activate said plurality of word lines, respectively, and each having at least one address input terminal, a first terminal which receives a first wafer burn-in signal, and a second terminal which receives a second wafer burn-in signal;

wherein said row address decode circuits activate all of said word lines when said first wafer burn-in signal and said second wafer burn-in signal are in an enable state, and wherein said row address decode circuits activate a subset of said word lines when said second wafer burn-in signal is in the enable state and said first wafer burn-in signal is in a disable state.

2. A memory circuit according to claim 1, wherein each of said row address decode circuit include:

a pre-decode circuit which outputs a pre-decode signal according to the first wafer burn-in signal, the second wafer burn-in signal and an address signal received from said at least one address input terminal;

a decode circuit which outputs a decode signal according to said pre-decode signal; and a word driver circuit which activates at least one of said plurality of word lines according to said decode signal.

3. A memory circuit comprising:

a plurality of word lines connected to a plurality of memory cells;

a plurality of pre-decode circuits which output a respective plurality of pre-decode signals according to an address signal, a first wafer burn-in signal, and a second wafer burn-in signal;

a plurality of decode circuits which output a respective plurality of decode signals according to said plurality of pre-decode signals; and a plurality of word driver circuits which selectively activate said respective plurality of word lines according to said respective plurality of decode signals;

wherein said pre-decode circuits output all of the respective pre-decode signals as a first logic level when said first wafer burn-in signal and second wafer burn-in signal are in an enable state, and wherein said pre-decode circuits output a subset of the respective pre-decode signals as the first logic level when said second wafer burn-in signal is in the enable state and said first wafer burn-in signal is in a disable state.

4. A memory circuit comprising:

a plurality of word lines connected to a plurality of memory cells;

a plurality of pre-decode circuits which output a respective plurality of pre-decode signals according to an address signal and a wafer burn-in signal;

a plurality of decode circuits which output a respective plurality of decode signals according to said respective plurality of pre-decode signals;

a first group of word driver circuits which activate a first subset of the plurality of word lines in response to a first group of said respective plurality of decode signals and a predetermined bit in said address signal; and a second group of word driver circuits which activate a second subset of the plurality of word lines in response to a second group of said respective plurality of decode signals and an inverted signal of said predetermined bit in said address signal, said first group of word driver circuits and said second group of word driver circuits being alternatively arranged.

5. A memory circuit comprising:

a plurality of word lines connected to a plurality of memory cells;

a plurality of pre-decode circuits which output a respective plurality of pre-decode signals according to an address signal;

a first group of decode circuits which outputs a first group of respective decode signals according to a first group of said respective plurality of pre-decode signals and a first wafer burn-in signal;

a second group of decode circuits which output a second group of respective decode signals according to a second group of said respective plurality of pre-decode signals and a second wafer burn-in signal; and a plurality of word driver circuits which activate said plurality of word lines according to said first and second groups of respective decode signals;

wherein said first group of decode circuits output the first group of respective decode signals as a first logic level when said first wafer burn-in signal is in an enable state, and said second group of decode circuits output the second group of respective decode signals as the first logic level when said second wafer burn-in signal is in the enable state, and wherein each of the plurality of word driver circuits are responsive to the first logic level to activate a respective one of the plurality of word lines.

6. A memory circuit according to claim 5 wherein said first group of decode circuits and second group of decode circuits are alternatively arranged.

* * * * *